(12) United States Patent
Ohgiyama et al.

(10) Patent No.: US 6,462,406 B2
(45) Date of Patent: *Oct. 8, 2002

(54) SEMICONDUCTOR DEVICE AND LEAD FRAME

(75) Inventors: Kenji Ohgiyama, Isahaya (JP); Teruhisa Fujihara, Isahaya (JP); Atsushi Yamasaki, Isahaya (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,712

(22) Filed: Jan. 21, 1999

(65) Prior Publication Data

US 2001/0045638 A1 Nov. 29, 2001

(30) Foreign Application Priority Data

May 12, 1998 (JP) .......................................... 10-128903

(51) Int. Cl.$^7$ .............................................. H01L 23/48
(52) U.S. Cl. ........................ 257/676; 252/782; 252/784
(58) Field of Search ................................ 257/676, 782, 257/784, 690, 692

(56) References Cited

U.S. PATENT DOCUMENTS

| 5,157,475 A | * | 10/1992 | Yamaguchi ................... 357/68 |
| 5,521,428 A | * | 5/1996 | Hollingsworth et al. .... 257/670 |
| 5,898,212 A | | 4/1999 | Kim |
| 6,020,625 A | * | 2/2000 | Qin et al. .................... 257/666 |
| 6,072,239 A | * | 6/2000 | Yoneda et al. .............. 257/730 |
| 6,114,556 A | * | 9/2000 | Kinsman .................... 257/676 |
| 6,130,473 A | * | 10/2000 | Mostafazadeh et al. ...... 257/666 |
| 6,191,490 B1 | * | 2/2001 | Huang ........................ 257/782 |

FOREIGN PATENT DOCUMENTS

| JP | 59-202652 | 11/1984 |
| JP | 61-218139 | 9/1986 |
| JP | 4-155857 | 5/1992 |
| JP | 8-153842 | 6/1996 |
| JP | 98-6169 | 3/1998 |

* cited by examiner

*Primary Examiner*—Jerome Jackson
*Assistant Examiner*—Lourdes Cruz
(74) *Attorney, Agent, or Firm*—Oblon, Spivak, McClelland, Maier & Neustadt, P.C.

(57) ABSTRACT

A semiconductor device including at least one die bond pad; at least one semiconductor element mounted on the at least one die bond pad; a plurality of substantially parallel wire bond pads connected to electrodes of the at least one semiconductor element, and disposed substantially in parallel to the at least one die bond pad in a longitudinal direction; and a sealing resin configured to mold the at least one semiconductor element, wherein back surfaces of the at least one die bond pad and the plurality of parallel wire bond pads are free from the sealing resin.

7 Claims, 12 Drawing Sheets

⟨Cross sectional view⟩

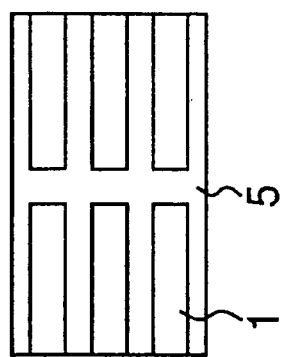
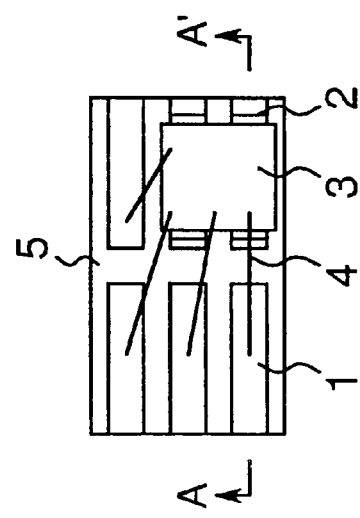
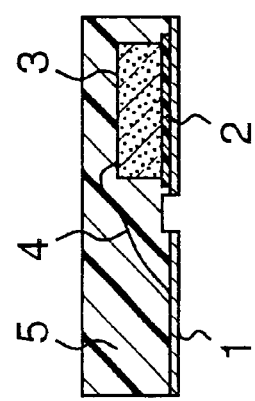

⟨Cross sectional view⟩   ⟨Top view⟩

⟨Cross sectional view⟩   ⟨Top view⟩

⟨Cross sectional view⟩   ⟨Top view⟩

⟨Cross sectional view⟩  ⟨Top perspective view⟩

⟨Cross sectional view⟩  ⟨Top view⟩

⟨Cross sectional view⟩

⟨Cross sectional view⟩  ⟨Top perspective view⟩

⟨Cross sectional view⟩  ⟨Top view⟩

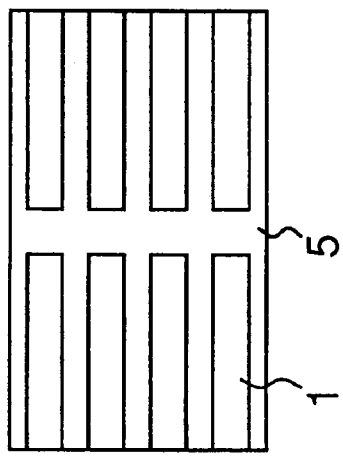
Fig.5C ⟨Bottom view⟩
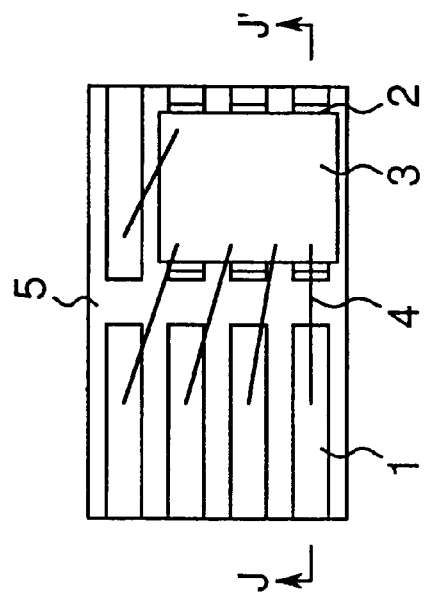
Fig.5B ⟨Top perspective view⟩
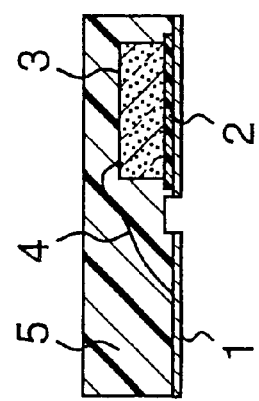
Fig.5A ⟨Cross sectional view⟩

⟨Cross sectional view⟩

⟨Top perspective view⟩

⟨Bottom view⟩

⟨Cross sectional view⟩  ⟨Top view⟩

⟨Cross sectional view⟩  ⟨Top view⟩

⟨Cross sectional view⟩

⟨Bottom view⟩

⟨Top perspective view⟩

⟨Cross sectional view⟩

⟨Cross sectional view⟩   ⟨Top view⟩

⟨Cross sectional view⟩

⟨Top perspective view⟩

PRIOR ART

PRIOR ART

PRIOR ART

⟨Cross sectional view⟩

⟨Top perspective view⟩

PRIOR ART

SEMICONDUCTOR DEVICE AND LEAD FRAME

BACKGROUND OF THE INVENTION

1. Filed of the Invention

The present invention relates to a method of producing a semiconductor device and a configuration thereof. More particularly, it relates to a method of producing a resin-sealed semiconductor device and a configuration thereof which make it possible to decrease the size, thickness, weight and cost of the device.

2. Description of the Related Art

FIGS. 10A and 10B show a gull-wing type semiconductor device with the configuration of the prior art, FIG. 10A being a cross sectional view thereof and FIG. 10B being a top view (perspective view) thereof.

A semiconductor device of this configuration is generally produced in such steps as shown in FIG. 11, in a procedure described below. A semiconductor element 3 is bonded by means of a die bonding material 2 on an island 14 of a lead frame 6 which has the islands 14 and leads 1 as shown in FIG. 12. Then after connecting an inner lead section 1a of the lead 1 surrounding the island 14 to an electrode pad located on the semiconductor element 3 by wire bonding of a wire 4 such as gold wire, the elements are sealed individually on both sides of the lead frame 6 by using a sealing resin 5. FIG. 13 is a top view of the semiconductor device with the configuration of the prior art after being sealed with the resin (the sealing resin is indicated with dotted line). In a last stage, an outer lead section 1b of the lead 1 is plated with tin or the like, cut off from the lead frame 6 and formed in gull wing shape, thereby to obtain the semiconductor device as in FIG. 12.

In the method of the prior art, it is necessary to prepare the lead frame 6 having the islands 14 matched to the size of the semiconductor elements 3 and molding dies (not shown) for sealing the individual semiconductor elements with resin. Therefore, when semiconductor elements 3 of different specifications are used, it is necessary to prepare different lead frames 6 and different molding dies for the various specifications.

In the semiconductor device of the prior art shown in FIG. 12, there has been a limitation on the reduction of the size and weight of the semiconductor device because the resin covers both sides of the lead frame 6.

Moreover, because heat generated by the semiconductor element 3 is dissipated through the lead 6, it is difficult to apply the device to power transistors which generate much heat and, because of the relatively long connection between the semiconductor element 3 and a mother board, it is also difficult to apply the device to high-frequency transistors or the like.

To counter such problems as described above, a molded transistor of chip on lead (COL) configuration wherein a semiconductor chip is directly connected on a lead is disclosed, for example, in Japanese Patent Kokai Publication No. 9-27584. However, since production of such a molded transistor requires different lead frames for different specifications and molding with the resin is carried out individually for each semiconductor element, different molding dies must be prepared for different specifications and therefore the above problems are not solved.

Also because the devices are mounted on the mother board by using outer leads, the technology is difficult to be applied to devices which generate much heat and high-frequency elements.

SUMMARY OF THE INVENTION

An object of the present invention to provide a method of producing the semiconductor device wherein semiconductor elements are sealed with resin by using the same lead and other means regardless of the specifications of the semiconductor elements, and a semiconductor device which can be reduced in size and weight and has good heat dissipation performance and high-frequency performance.

The present inventors have intensively studied. As a result, they found that semiconductor devices can be produced with a same lead frame regardless of the specifications of semiconductor elements when a plurality of the semiconductor elements are mounted on the lead frame having the leads disposed substantially parallel to each other and, after sealing the whole with a resin, the individual semiconductor devices are cut off, and that the semiconductor device produced with this method has improved heat dissipation performance and high-frequency performance. Thus, the present invention has been accomplished.

The invention provides a method of producing a semiconductor device comprising a die bond pad, a wire bond pad, a semiconductor element mounted on the die bond pad, and a sealing resin for molding the semiconductor elements, which comprises preparing a lead frame having a plurality of leads disposed substantially in parallel to each other at intervals in the longitudinal direction in the same plane; bonding a plurality of semiconductor elements in parallel on at least one lead surface of the lead frame; electrically connecting an electrode of each semiconductor element, the lead having the semiconductor element bonded thereon and another lead adjacent therewith in the longitudinal direction; molding the plurality of semiconductor elements together by means of the sealing resin applied from above the lead surface so that the back side of the lead is exposed; and cutting the leads in the longitudinal direction to divide the lead with the semiconductor element being bonded thereon into a portion where the semiconductor element is bonded thereon and a portion which is connected to the electrode, and to divide the other lead into portions connected to different electrodes, thereby to take the lead with the semiconductor element being bonded thereon as a die bond pad, and to take the lead connected to the electrode as a wire bond pad.

With this method of producing the semiconductor element, it becomes possible to produce the semiconductor device having semiconductor elements of different sizes mounted thereon by using the lead frame of the same configuration, and therefore the production process can be simplified and the production cost can be reduced.

Also with this method, because the lead frame whereon the semiconductor elements are bonded is sealed with the resin as a whole at the same time, it is not necessary to prepare different molding dies for resin sealing of semiconductor devices of different sizes as in the case of the prior art where the semiconductor devices are sealed with a resin individually, thus making it possible to reduce the production cost.

In mass production, because the semiconductor devices are made by cutting off the lead frame whereon the semiconductor elements are mounted consecutively as shown in FIG. 3A, there is no part of the lead frame to be wasted, so that product yield per unit area of the lead frame is improved and the production cost can be reduced.

Moreover, even when the size of the semiconductor element is changed, the semiconductor devices can be produced by using the same lead frame. Thus, it is not necessary to prepare lead frames having islands of different sizes for the semiconductor elements of different sizes as in the case of the prior art, thereby making it possible to reduce the production cost by using the common lead frame.

The present invention provides a method of producing a semiconductor device comprising a die bond pad, a wire bond pad, a semiconductor element mounted on the die bond pad, and a sealing resin for molding the semiconductor element, which comprises preparing a lead frame having comb-shaped leads which are symmetrically disposed substantially in parallel and opposite to each other at intervals in the longitudinal direction in the same plane; bonding semiconductor elements on every other leads among the leads arranged in the longitudinal direction on at least one side of the symmetrical arrangement; electrically connecting an electrode of the semiconductor element and another lead adjacent to the former lead; molding the semiconductor elements together by means of the sealing resin applied from above the lead surface so that the back side of the lead is exposed; and cutting the lead and the sealing resin in the longitudinal direction to separate from the lead frame, thereby to take the lead with the semiconductor element bonded thereon as a die bond pad, and to take the lead connected to the electrode as a wire bond pad.

A plurality of wire bond pads can be made similarly also by using the lead frame having the leads which are cut beforehand, as described above.

The semiconductor element may also be bonded across a plurality of the leads which are disposed in the longitudinal direction.

This method makes it possible to produce the semiconductor device by using the same lead frame even when size of the semiconductor element is changed, and therefore production cost can be reduced by using the common lead frame.

The semiconductor element may also be bonded across a plurality of the leads which are disposed in the lateral direction to oppose each other.

This method makes it possible to produce the semiconductor device by using the same lead frame even when size of the semiconductor element, the electrode position and/or other specifications are changed, and therefore production cost can be reduced by using the common lead frame.

The semiconductor element may also be bonded onto the lead surface by means of an electrically conductive or insulating bonding material.

When an electrically conductive resin is used, the semiconductor element and the lead below thereof can be electrically connected.

The present invention also provides a method of producing the semiconductor device, wherein the sealing resin is cut off in the lateral direction outside a plurality of the semiconductor elements so that the plurality of semiconductor elements arranged in the longitudinal direction are molded in the same sealing resin.

By employing this method, it becomes possible to produce the semiconductor device where the plurality of semiconductor elements are molded together in the sealing resin.

The number of the semiconductor elements sealed in the semiconductor device can be freely changed by changing the cutting position.

The present invention also provides a lead frame comprising a plurality of leads arranged substantially parallel to each other in the longitudinal direction at intervals in the same plane.

By supplying the leads in the form of the lead frame described above, handling of the leads is made easier.

The present invention also provides a lead frame having comb-shaped leads which are symmetrically disposed and opposing substantially in parallel to each other at intervals in the longitudinal direction in the same plane.

By using the lead frame of this configuration, it becomes unnecessary to provide a step of half-cutting the leads which have been sealed with resin.

The present invention also provides a semiconductor device comprising a die bond pad with a semiconductor element mounted on the top surface thereof, a wire bond pad arranged substantially in parallel to the die bond pads in the longitudinal direction and connected to electrodes of the semiconductor elements, and a sealing resin for molding the semiconductor element, wherein additional wire bond pads are disposed in parallel with the die bond pads and the wire bond pads, while the sealing resin is applied from above the die bond pads and the wire bond pads so that the back surfaces of the die bond pads and the wire bond pads are exposed.

In a semiconductor device of such a configuration as described above, only the top surface of the semiconductor device is sealed with the resin while the die bond pads and the wire bond pads formed by cutting off the leads are exposed on the back surface, and therefore it becomes possible to decrease the mounting area and height compared to the semiconductor device with the configuration of the prior art which are connected to the mother board by using outer leads, thus contributing to the reduction in the size and weight of the device.

Also because the die bond pads and the wire bond pads are directly connected to the mother board, heat dissipation from the semiconductor element is improved in comparison to the prior art configuration.

Thus, it becomes possible to secure stable operation even when high output power elements, which generate much heat are used for the semiconductor elements.

Also because the distance of connecting the mother board and the semiconductor element can be made shorter than that with the configuration of the prior art where connection with the mother board is made by using the outer leads, good high-frequency characteristics can be obtained even when a high-frequency element is used for the semiconductor element.

Also bonding area for bonding the semiconductor device onto the mother board with solder or the like by using the die bond pads and the wire bond pads is increased, thus making it possible to increase the bonding strength.

The present invention also provides a semiconductor device having at least two die bond pads.

The semiconductor element may also be mounted across a plurality of the die bond pads which are arranged in the longitudinal direction.

Die bond pads may also be disposed side by side with the die bond pads described above, with the semiconductor elements mounted across these die bond pads.

The present invention also provides a semiconductor device wherein a plurality of semiconductor elements which are disposed in longitudinal direction are molded with the same sealing resin.

As will be clear from the above description, according to the method of producing the semiconductor element of the present invention, because it is not necessary to prepare lead frames suitable for the individual semiconductor elements to be mounted thereon and the lead frame can be used in common, the production process can be simplified and the production cost can be reduced.

This method also makes it possible to use the lead frame in common by mounting the semiconductor element across a plurality of leads even when the semiconductor element of greater size is mounted.

Also because the lead frame with the semiconductor elements mounted thereon is sealed with the resin as a whole, it is not necessary to prepare different molding dies for various sizes of the semiconductor devices, thus the production process can be simplified and the production cost can be reduced.

Particularly because the lead frame with the semiconductor elements mounted thereon consecutively is cut off to make the semiconductor devices in this method, there is no part of the lead frame wasted, so that product yield per unit area of the lead frame is improved and the production cost can be reduced.

Also in the semiconductor device of the present invention, because only the front surface of the semiconductor device is sealed with the resin while the die bond pad and the wire bond pad formed on the back surface by cutting off the leads are exposed, the semiconductor device can be connected directly onto the mother board by using the back surface of the semiconductor device, thus making it possible to reduce the mounting area and height, thereby contributing to the reduction of size and weight.

Also because the die bond pad and the wire bond pad are connected directly to the mother board, heat dissipation from the semiconductor element can be improved, and the present invention can be applied to high-output power elements which generate much heat.

Also because the distance of connecting the mother board and the semiconductor element can be reduced, good high-frequency characteristic can be obtained when high-frequency element is used for the semiconductor element.

Also the bonding area for fastening the semiconductor device onto the mother board with solder or the like by using the die bond pads and the wire bond pads increases, thus making it possible to increase the bonding strength.

BRIEF DESCRIPTION OF THE DRAWINGS

FIGS. 1A–1C show a semiconductor device according to the first embodiment of the present invention.

FIGS. 5A–5C show another semiconductor device according to the first embodiment of the present invention.

FIG. 5A shows a cross-sectional view taken along line J–J' of the top view illustrated in FIG. 5B.

FIG. 6A shows a cross-sectional view taken along line K–K' of the top view illustrated in FIG. 6B.

FIG. 8A shows a cross-sectional view taken along line O–O' of the top view illustrated in FIG. 8B.

FIG. 10A shows a cross-sectional view taken along line Q–Q' of the top view illustrated in FIG. 10B.

FIG. 14A shows a cross-sectional view taken along line R–R' of the top view illustrated in FIG. 14B.

PREFERRED EMBODIMENTS OF THE INVENTION

Embodiment 1

Figure 2A:
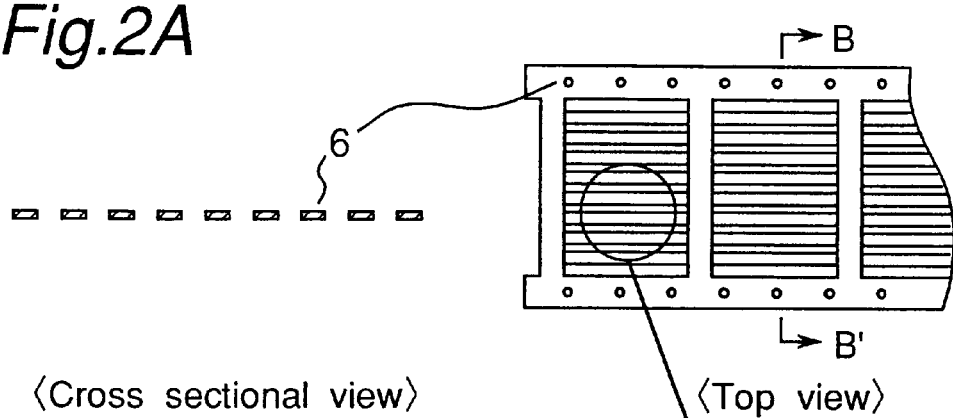
FIGS. 2A–2C show a production flow chart of the semiconductor device according to the first embodiment of the present invention. The left sides of FIGS. 2A, 2B and 2C show cross-sectional views taken respectively along lines B–B', C–C', and D–D' of the top views illustrated on the right sides of these figures.

First embodiment of the present invention will now be described below with reference to FIGS. 1A–5C. In the drawing, the same reference numerals as those in FIG. 12 denote the identical or corresponding parts.

FIGS. 1A–1C show a semiconductor device according to this embodiment, with FIG. 1A showing a cross sectional view taken along lines A–A', FIG. 1B showing a top view and FIG. 1C showing a bottom view. In the following production flow chart, top view is shown on the right and cross sectional view is shown on the left.

In this semiconductor device, the semiconductor element 3 is mounted across two of three leads 1 disposed in parallel to each other, by means of a die bonding material 2. The lead 1 is cut off at the center (half cut) and separated into a die bond pad whereon the semiconductor element 3 is bonded and a wire bond pad which is electrically connected to an electrode of the semiconductor element 3 by using a wire 4 such as gold wire. The semiconductor element is molded with a sealing resin 5 such as epoxy resin applied to only one side of the lead 1.

A method of producing the semiconductor device described above will be described below. First, such a lead frame 6 is prepared so that a plurality of leads are arranged in parallel to each other at intervals in the same plane. The lead frame 6 is shown in FIG. 2A as a top view on the right and cross sectional view taken along lines B–B' on the left. The lead frame 6 is preferably made of copper, 4-2 alloy or the like.

Figure 2B:
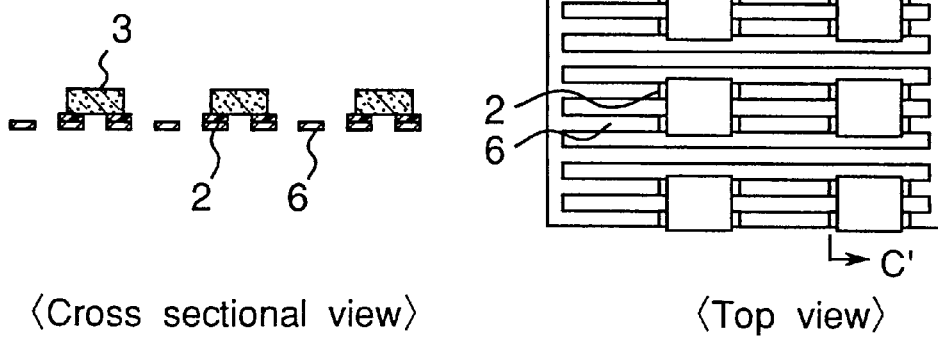

Then as shown in the die bonding step of FIG. 2B, a plurality of the semiconductor elements 3 are mounted across two lead frames 6. A die bonding material 2 such as epoxy resin is used to bond the semiconductor elements. An electrically conductive adhesive is used when the lead and the back surface of the semiconductor element 3 are to be electrically connected.

Figure 2C:
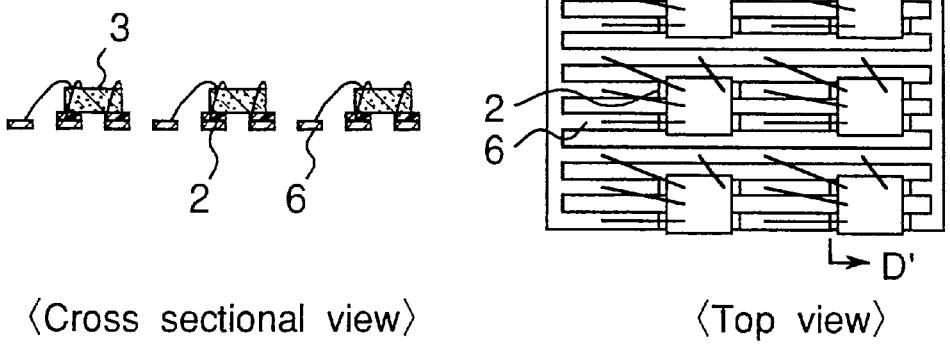

Then as shown in the wire bonding step of FIG. 2C, an electrode of the semiconductor element 3 and the lead frame 6 are electrically connected by means of the wire 4 such as gold wire. While four wires 4 are formed in FIG. 2C, more wires 4 may be formed between the semiconductor element 3 and the lead frame 6 surrounding the semiconductor element 3 according to the number of electrodes of the semiconductor element 3.

Figure 3A:
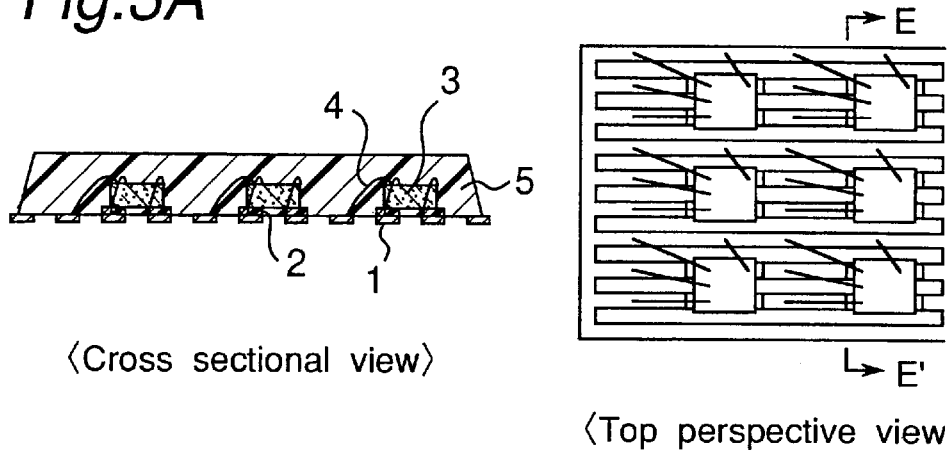
FIGS. 3A–3C show a production flow chart of the semiconductor device according to the first embodiment of the present invention. The left sides of FIGS. 3A, 3B and 3C show cross-sectional views taken respectively along lines E–E', F–F', and G–G' of the top views illustrated on the right sides of these figures.

Then as shown in the resin sealing step of FIG. 3A, the plurality of semiconductor elements 3 are sealed as a whole with the sealing resin 5 such as epoxy resin.

Figure 10A:
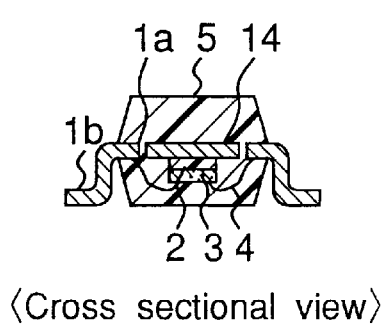
FIGS. 10A, 10B show a semiconductor device of the prior art.
Figure 10B:
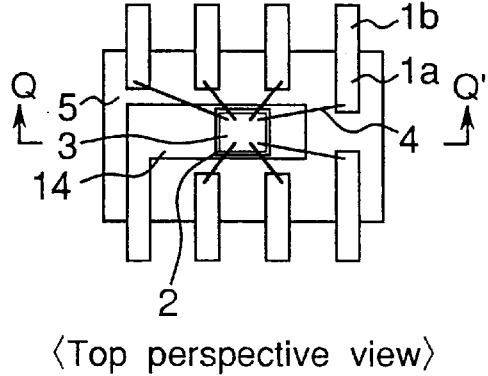
Figure 11:
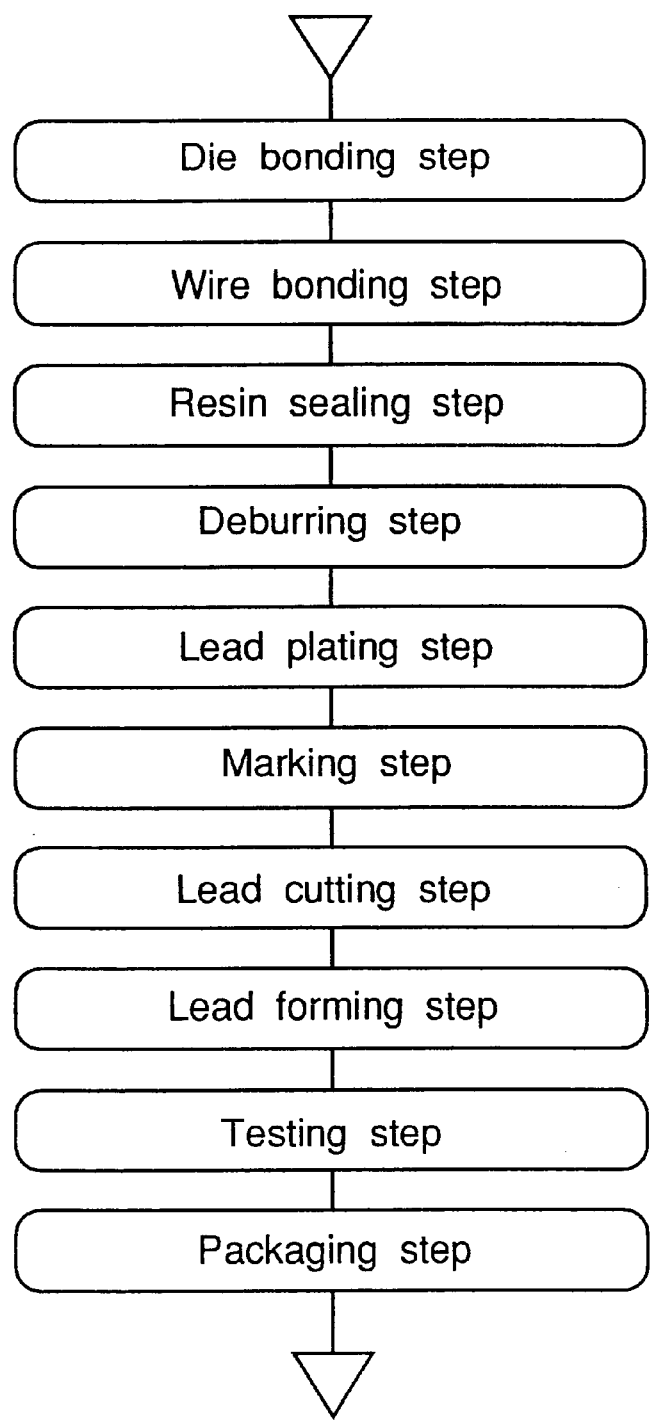
FIG. 11 shows a production flowchart of the semiconductor device with the configuration of the prior art.

In the resin sealing step, only one side of the lead whereon the semiconductor element 3 is bonded is sealed, instead of sealing both sides of the lead as shown in FIGS. 10A and 10B.

Also the plurality of semiconductor elements 3 are sealed together, instead of sealing the individual semiconductor elements 3 by using different molding dies for different semiconductor elements as in the prior art.

Figure 3B:
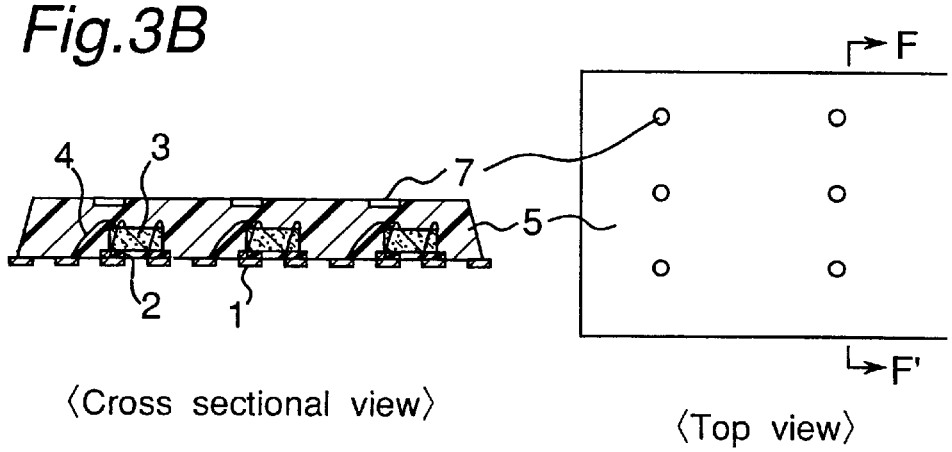

Then as shown in the marking step of FIG. 3B, a marking is made for locating the semiconductor element 3 sealed with the sealing resin 5. The marking is made by changing the property of the sealing resin 5 in a predetermined portion by using, for example, YAG laser.

Figure 3C:
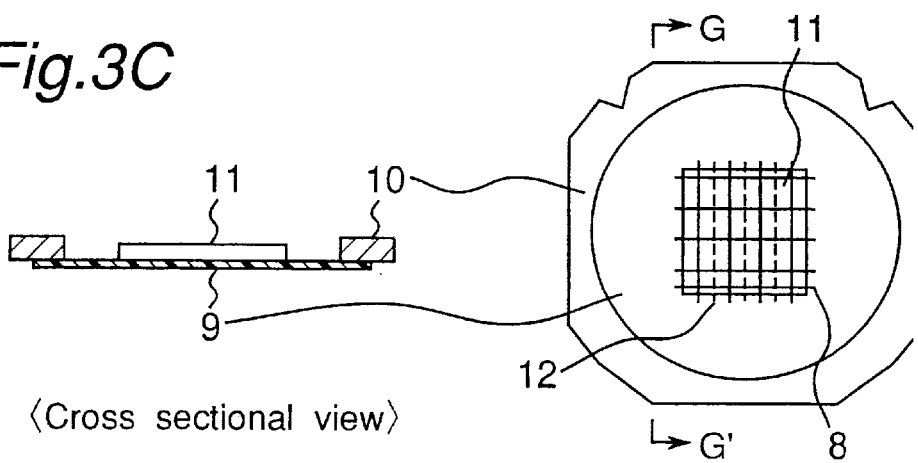

Then as shown in the separation step of FIG. 3C, the semiconductor elements sealed with the resin on the lead frame 6 are separated to make the individual semiconductor devices.

Figure 4A:
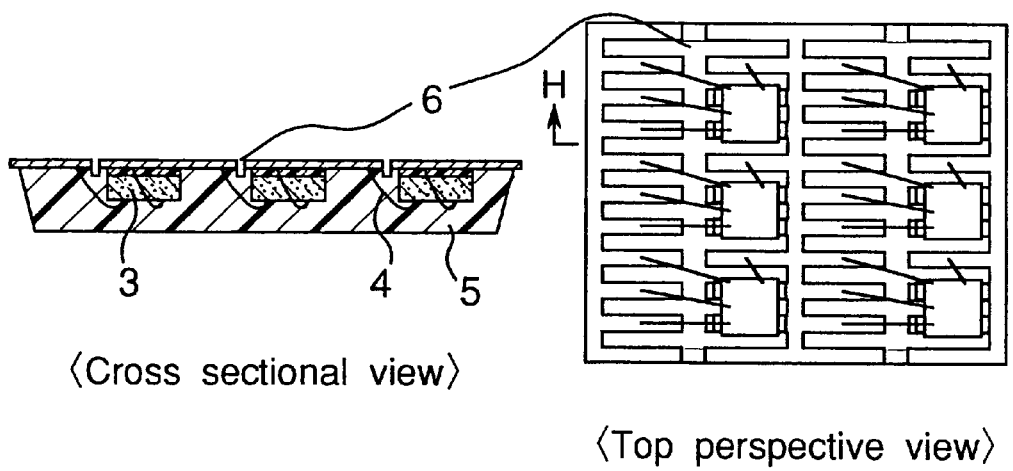
FIGS. 4A, 4B show a production flow chart of the semiconductor device according to the first embodiment of the present invention. The left sides of FIGS. 4A and 4B show cross-sectional views taken respectively along lines H–H' and I–I' of the top views illustrated on the right sides of these figures.

Cutting (dicing) is carried out in the following procedure. First, the lead frame 6 is cut in on the back surface along a half-cut line 12 to such a depth that the wire 4 will not be cut, in order to cut off the leads. In the half-cut step, as shown in FIG. 4A, cutting the lead results in complete separation of the portion whereon the semiconductor element 3 is mounted and the portion which is connected to the electrode of the semiconductor element 3, which are thereby electrically disconnected. As the lead with wires 4 connected thereto is cut off, the two portions become wire bond pads.

Then the lead and the sealing resin 5 are cut off along the cutting line 8, thereby separating the semiconductor elements 3 and completing the semiconductor devices.

Thus the lead whereon the semiconductor element 3 is bonded becomes the die bond pad and the lead connected to the electrode of the semiconductor element 3 with the wire 4 becomes the wire bond pad.

The semiconductor devices are tested for electric characteristics while being attached onto the adhesive tape 9, and are completed when detached from the adhesive tape 9.

The semiconductor devices may also be tested for electric characteristics after being removed from the adhesive tape 9.

Figure 4B:
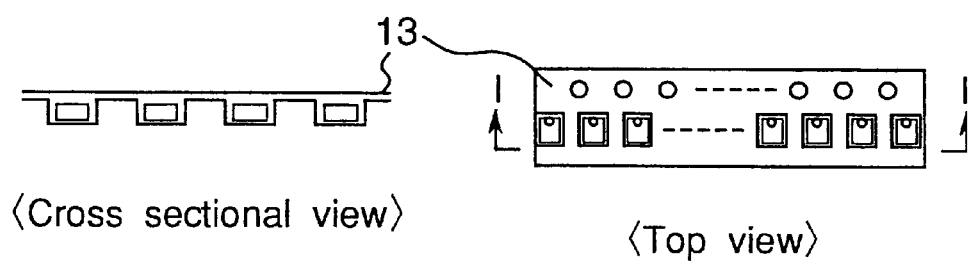

Last, as shown in packaging step of FIG. 4B, the finished semiconductor devices are placed on an embossed tape 13 made of paper or the like or a tray and packaged. FIG. 4B shows the state after being packaged.

As described above, the semiconductor devices produced in the method described above according to this embodiment are sealed with the resin only on the top surface thereof, while the die bond pads and the wire bond pads formed on the back surface by cutting off the leads are exposed.

Therefore, the semiconductor devices of this embodiment are connected directly to the mother board by using the back surface of the semiconductor device, not by using the outer lead 1b as in the case of the semiconductor device of the prior art shown in FIGS. 10A and 10B, thus making it possible to reduce the semiconductor device smaller in the mounting area and height, thereby contributing to the reduction of size and weight.

Also because the die bond pads and the wire bond pads are connected directly to the mother board, heat dissipation from the semiconductor element is improved compared with that with the configuration of the prior art. Thus stable operation can be achieved even when a high output power element generating greater heat is used for the semiconductor element 3.

Also because connecting distance between the mother board and the semiconductor element 3 can be made shorter than that of the conventional configuration where connection to the mother board is made by using the inner lead 1a and the outer lead 1b, it is made possible to obtain good high-frequency characteristic even when a high-frequency element is used for the semiconductor element 3.

Figure 14A:
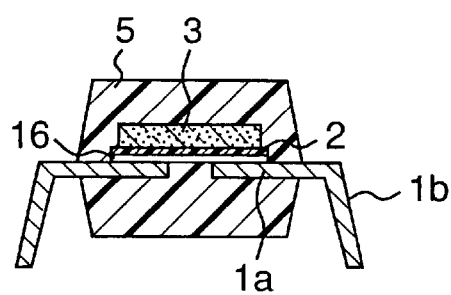
FIGS. 14A, 14B show another semiconductor device with the configuration of the prior art.
Figure 14B:
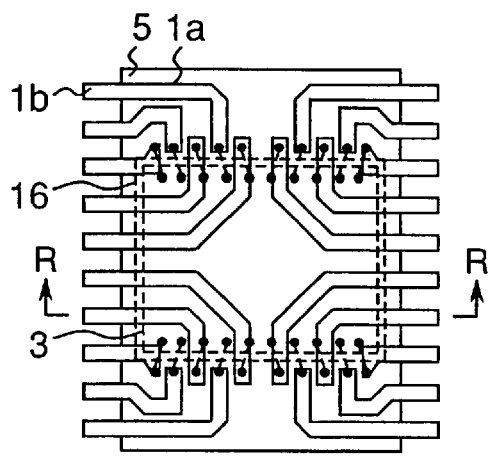

In the case of the semiconductor device with the configuration of the prior art shown in FIGS. 10A and 10B and the COL type semiconductor device shown in FIGS. 14A–14B which are connected to the mother board by using the outer lead 1b, it is difficult to reduce the semiconductor device smaller in size and weight and improve the heat dissipation characteristic and the high-frequency characteristic unlike the semiconductor device of this embodiment.

Moreover, the bonding area for fastening the semiconductor device onto the mother board with solder or the like by using the die bond pads and the wire bond pads becomes greater, thus making it possible to increase the bonding strength.

Figure 12:
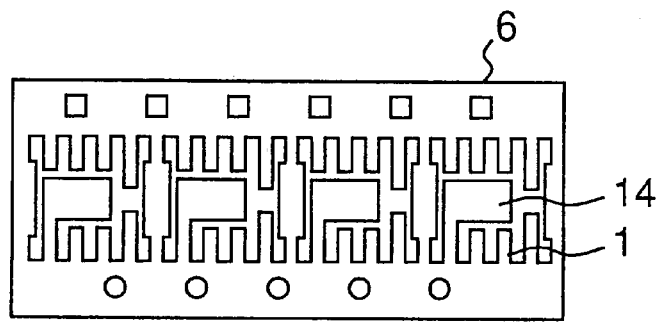
FIG. 12 shows a lead frame used in the production of the semiconductor device with the configuration of the prior art.
Figure 13:
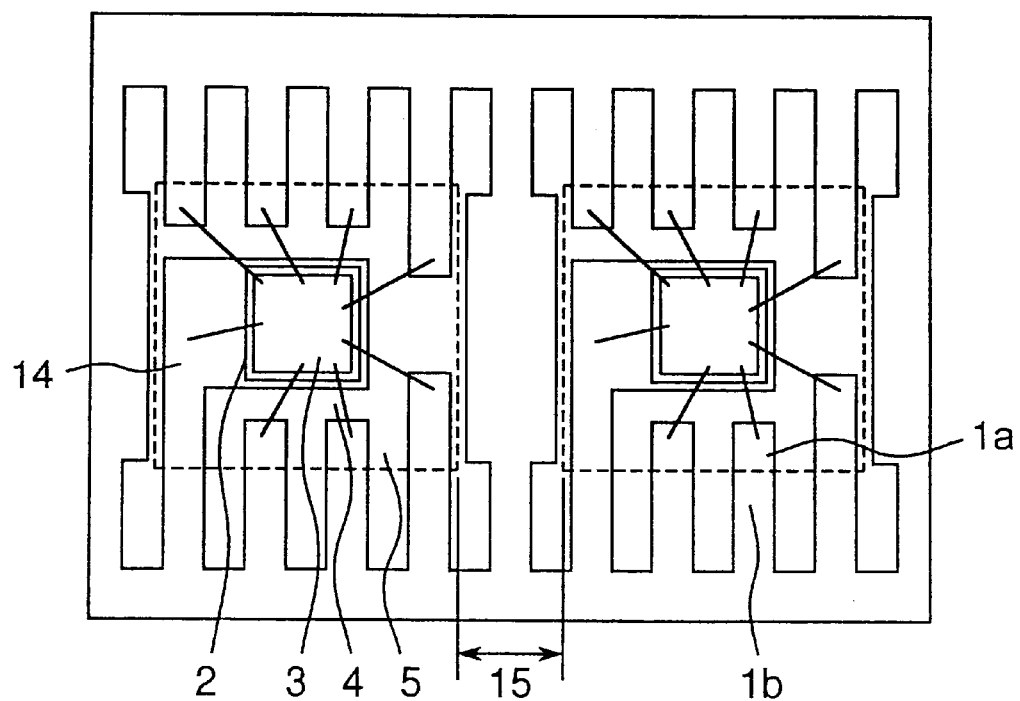
FIG. 13 shows a production flow chart of the semiconductor device with the configuration of the prior art.

Also according to the method of producing the semiconductor device of this embodiment, a plurality of the semiconductor elements are mounted on the lead frame 6 having the leads arranged parallel to each other and, after sealing with the resin, cut into the individual semiconductor devices. Consequently, the lead frame 6 can be used in common thus making it possible to simplify the production process and reduce the production cost, compared to the method of the prior art where the lead frames 6 having the islands 14 designed for the semiconductor elements to be mounted on as shown in FIG. 12 are prepared.

Also because the lead frame whereon the semiconductor elements 3 are bonded is sealed with the resin as a whole, it is not necessary to prepare different molding dies for resin sealing of different semiconductor devices unlike the case of the prior art where the semiconductor devices are sealed with resin individually, thus making it possible to reduce the production cost.

In mass production, in particular, because the semiconductor devices are made by cutting off the lead frame 6 whereon the semiconductor elements are bonded consecutively as shown in FIG. 3A, there is no part of the lead frame 6 to be wasted, so that product yield per unit area of the lead frame 6 is improved and the production cost can be reduced.

While the semiconductor element 3 is mounted across two leads in this embodiment, the semiconductor element 3 may also be mounted across three leads as shown in FIG. 5, for example, when greater semiconductor element 3 is used.

Thus, when the method of this embodiment is used, the semiconductor devices can be produced by using the same lead frame 6 even when the size of the semiconductor elements 3 is changed. This makes it unnecessary to use the lead frame 6 having the islands 14 of different sizes designed for the size of the semiconductor elements as in the prior art, and therefore it is made possible to reduce the production cost by using the common lead frame 6.

Embodiment 2

Second embodiment of the present invention will be described below with reference to FIGS. 6A–7C.

Figure 6A:
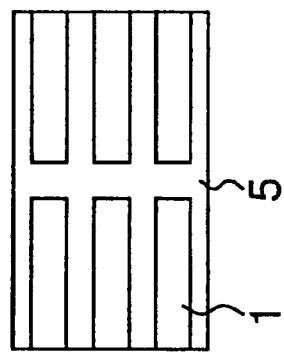
FIGS. 6A–6C show the semiconductor device according to the second embodiment of the present invention.
Figure 6B:
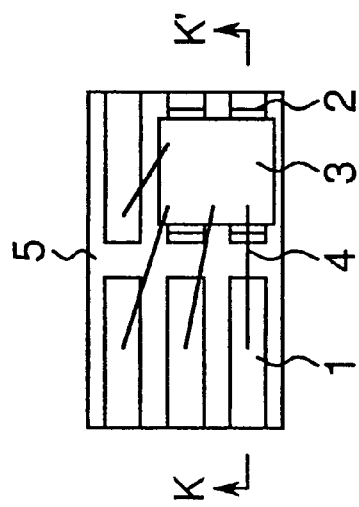
Figure 6C:
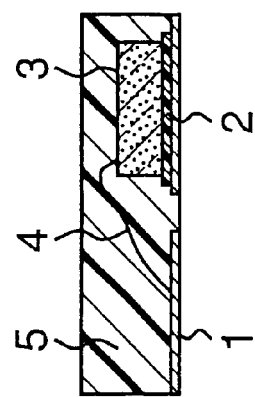

FIGS. 6A–6C show the semiconductor device of this embodiment in FIG. 6A cross sectional view, FIG. 6B top view and FIG. 6C bottom view, with the same reference numerals as those in FIGS. 1A–1C denoting the identical or corresponding portions.

A method of producing the semiconductor device will be described below.

Figure 7A:
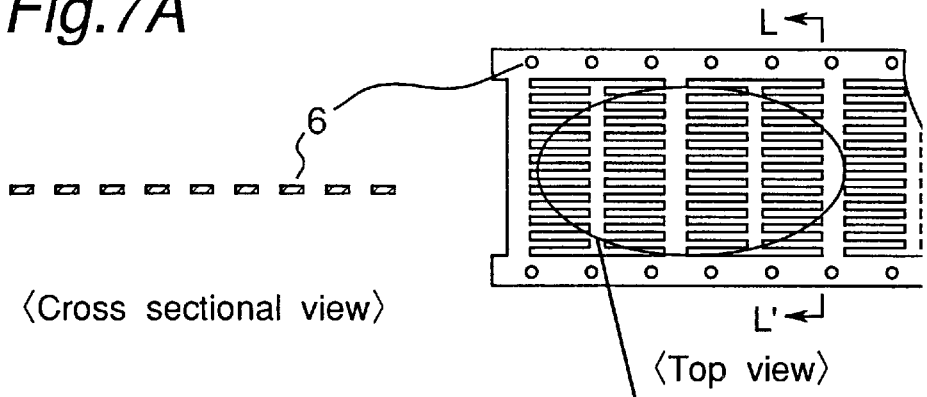
FIGS. 7A–7C show a production flow chart of the semiconductor device according to the second embodiment of the present invention. The left sides of FIGS. 7A, 7B and 7C show cross-sectional views taken respectively along lines L–L', M–M', and N–N' of the top views illustrated on the right sides of these figures.

According to the method of this embodiment, first a lead frame 6 as shown in FIG. 7A is prepared. The lead frame 6 is the same as that of the first embodiment in that a plurality of leads are disposed substantially in parallel to each other in the same plane, but it is different in that each lead is cut off at the center thereof beforehand.

Figure 7B:
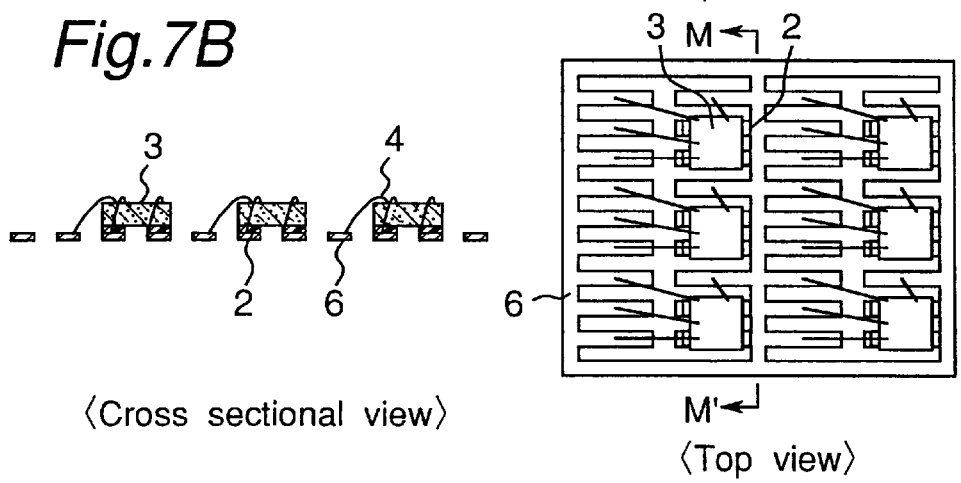

Then as shown in FIG. 7B, the semiconductor element 3 is mounted across two leads and an electrode of the semiconductor element 3 is electrically connected to surrounding leads by means of the wire 4.

Figure 7C:
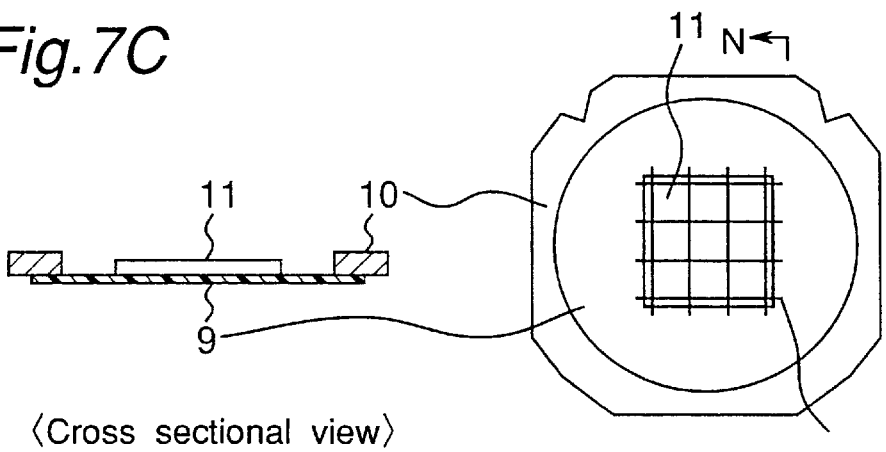

The semiconductor devices are separated by the same dicing method as that of the first embodiment as shown in FIG. 7C.

According to this embodiment, since the lead frame 6 having the leads which have been cut off at the center thereof beforehand is used, the half-cut step wherein only the leads are cut off as in the first embodiment becomes unnecessary.

The semiconductor device shown in FIGS. 6A–6C can also be produced by employing the method of this embodiment as described above.

In this case, the half-cut step becomes unnecessary when separating the semiconductor devices, thus simplifying the production process.

In case the semiconductor devices are made smaller resulting in shorter distance between the half-cut portion and the wire 4 formed thereon, in particular, it is preferable that this method of using the lead frame 6 having the leads which are cut off beforehand be employed because it is difficult to control the depth of half cut.

Embodiment 3

Third embodiment of the present invention will be described below with reference to FIGS. 8A–8C and FIG. 9.

Figure 8C:
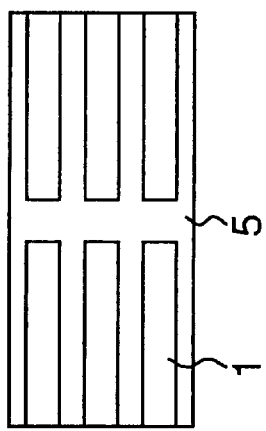
FIGS. 8A–8C show a semiconductor device according to the third embodiment of the present invention.
Figure 8B:
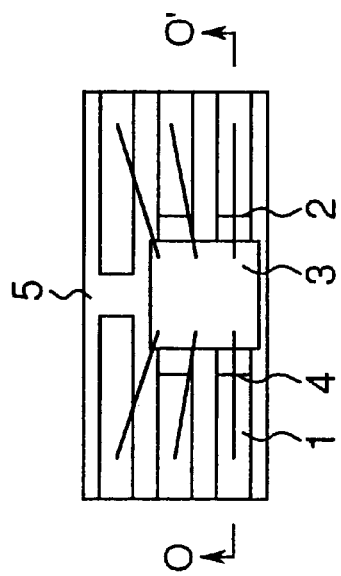
Figure 8A:
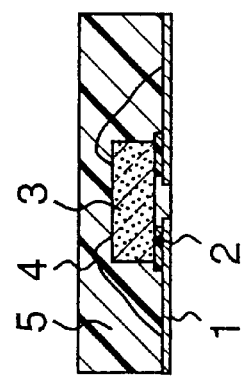

FIGS. 8A–8C show the semiconductor device of this embodiment in FIG. 8A cross sectional view, FIG. 8B top view and FIG. 8C bottom view, with the same reference numerals as those in FIGS. 1A–1C denoting the identical or corresponding portions. In FIGS. 8A–8C, the semiconductor element 3 is mounted across two leads and across the cut portion of the lead.

Figure 9:
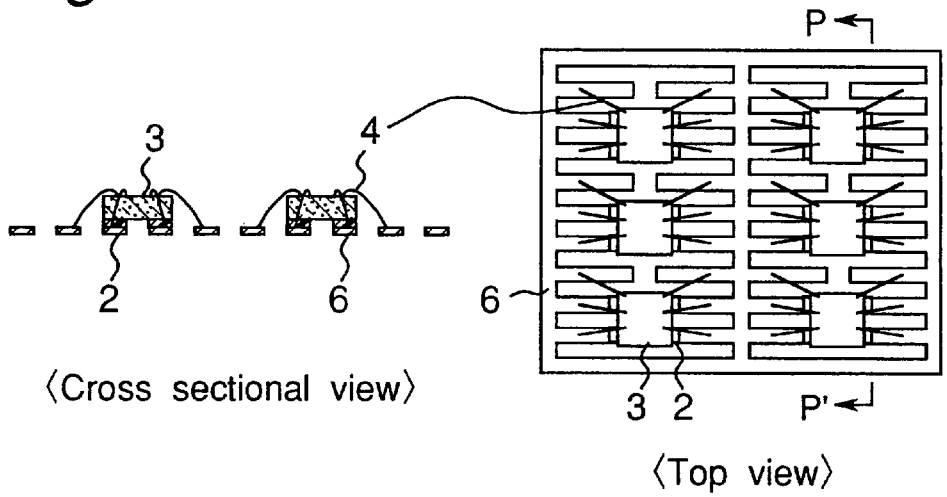
FIG. 9 shows a third embodiment of the present invention. The left side of FIG. 9 shows a cross-sectional view taken along line P–P' of the top view illustrated on the right side of this figure.

The semiconductor device is produced by preparing the lead frame 6 which is used in the above Embodiment 1 having leads being cut beforehand, bonding the semiconductor element 3 on the lead frame 6 by using the die bonding material 2 as shown in FIG. 9, then connecting the electrodes of the semiconductor element 3 to surrounding leads with the wires 4. In this embodiment, an insulating material is used for the die bonding material 2.

This configuration makes it possible to increase the number of leads connected to the wires 4 while reducing the length of the wire 4 and making it uniform.

What is claimed is:

1. A semiconductor device comprising:
at least two die bond pads arranged in a longitudinal direction;
at least one semiconductor element mounted across said at least two die bond pads arranged in said longitudinal direction;
a plurality of substantially parallel wire bond pads connected to electrodes of said at least one semiconductor element, and disposed substantially in parallel to said at least two die bond pads in said longitudinal direction; and
a sealing resin configured to mold said at least one semiconductor element,
wherein back surfaces of said at least two die bond pads and back surfaces of said plurality of substantially parallel wire bond pads are free from said sealing resin.

2. A semiconductor device comprising:
at least two die bond pads arranged in a longitudinal direction;
at least one semiconductor element mounted across said at least two die bond pads arranged in said longitudinal direction;
a plurality of substantially parallel wire bond pads connected to electrodes of said at least one semiconductor element, and disposed substantially in parallel to said at least two die bond pads in said longitudinal direction; and
a sealing resin configured to mold said at least one semiconductor element,
wherein back surfaces of said at least two die bond pads and back surfaces of said plurality of substantially parallel wire bond pads are free from said sealing resin, and
wherein a plurality of semiconductor elements are mounted across a plurality of die bond pads.

3. The semiconductor device of claim 2, wherein said sealing resin is configured to mold said plurality of semiconductor elements.

4. The semiconductor device of claim 3, made by a process comprising:
bonding each semiconductor element of a plurality of semiconductor elements to at least one lead of a plurality of leads arranged substantially in parallel in a longitudinal direction in a plane;
electrically connecting an electrode of each of said plurality of semiconductor elements to one of said plurality of leads;
applying a sealing resin from above said plurality of leads so as to mold said plurality of semiconductor elements and keeping back sides of said plurality of leads free from said sealing resin; and
cutting said plurality of leads to divide leads mounted by semiconductor elements into portions mounted by semiconductor elements and portions connected to electrodes, and to divide leads not mounted by semiconductor elements into portions connected to different electrodes.

5. The semiconductor device of claim 4, wherein:
the bonding step is performed by bonding semiconductor elements on every other lead of a lead frame having comb-shaped leads symmetrically arranged substantially in parallel and opposite to each other at intervals in the longitudinal direction in said plane; and
the electrically connecting step is performed by connecting electrodes to leads adjacent to the leads bonded by semiconductor elements.

6. A lead frame for manufacturing the semiconductor device of claim 2, comprising a plurality of leads arranged at intervals in a plane and substantially parallel to each other in a longitudinal direction.

7. A lead frame for manufacturing the semiconductor device of claim 2, comprising comb-shaped leads opposing each other symmetrically, arranged at intervals in a plane, and substantially parallel to each other in a longitudinal direction.

* * * * *